United States Patent [19]
Estakhri

[11] Patent Number: 6,041,001
[45] Date of Patent: Mar. 21, 2000

[54] METHOD OF INCREASING DATA RELIABILITY OF A FLASH MEMORY DEVICE WITHOUT COMPROMISING COMPATIBILITY

[75] Inventor: Petro Estakhri, Pleasanton, Calif.

[73] Assignee: Lexar Media, Inc., Fremont, Calif.

[21] Appl. No.: 09/258,163

[22] Filed: Feb. 25, 1999

[51] Int. Cl.[7] .................................................. G11C 7/00
[52] U.S. Cl. .......................... 365/200; 371/30; 371/40.2; 371/40.11; 371/40.18
[58] Field of Search ............................... 365/200, 185.09, 365/185.33; 371/30, 40.11, 40.13, 40.2, 40.18

[56] References Cited

U.S. PATENT DOCUMENTS

| | | | |
|---|---|---|---|
| 5,233,610 | 8/1993 | Nakayama et al. | 371/5.1 |
| 5,459,742 | 10/1995 | Cassidy et al. | 371/40.1 |
| 5,603,001 | 2/1997 | Sukegawa et al. | 395/430 |
| 5,740,188 | 4/1998 | Olarig | 371/40.11 |
| 5,754,753 | 5/1998 | Smelser | 395/182.06 |
| 5,832,005 | 11/1998 | Singh | 371/51.1 |
| 5,922,080 | 7/1999 | Olarig | 714/767 |
| 5,958,079 | 9/1999 | Yoshimura | 714/766 |

*Primary Examiner*—David Nelms
*Assistant Examiner*—Hien Nguyen
*Attorney, Agent, or Firm*—Haverstock & Owens LLP

[57] ABSTRACT

A method for increasing the data reliability of a flash memory device without compromising compatibility with existing memory products or an existing memory format makes only minor modifications to the flash memory device. Inside the flash memory device which supports a low power Error Correcting Code known as Hamming Code, the flash memory cells are divided into groups called blocks. Each block is further divided into units called sectors. Each sector is partioned into well defined areas of bits including: SCRATCH DATA, DATA STATUS, and BLOCK STATUS. According to the method, the bits in DATA STATUS and BLOCK STATUS are modified within the specifications of the existing memory format so they can serve as indicators of the increased data reliability capacity of the flash memory device but continue to carry out the function allocated by the existing memory format. Additionally, the SCRATCH DATA is converted into a repository for the data reliability bits for a high power Error Correcting Code (HP ECC). Finally, a newly-designed controller is utilized to perform the Hamming Code or the HP ECC on the data bits being programmed into or read from the flash memory device. The DATA STATUS and the BLOCK STATUS are decoded to determine which ECC to perform on the data bits.

41 Claims, 5 Drawing Sheets

METHOD OF INCREASING DATA RELIABILITY OF A FLASH MEMORY DEVICE WITHOUT COMPROMISING COMPATIBILITY

FIELD OF THE INVENTION

The present invention relates to the field of flash memory devices. More particularly, the present invention relates to techniques for improving the data reliability of a flash memory device while retaining compatibility with an existing memory format and existing memory products.

BACKGROUND OF THE INVENTION

A flash memory device is an electrically rewritable non-volatile digital memory device that does not require a power source to retain its memory contents. A typical flash memory device stores charge on a floating gate to represent a first logic state in the binary state system, while the lack of stored charge represents a second logic state in the binary state system. Additionally, the typical flash memory device is capable of performing a write operation, a read operation, and an erase operation.

Within the flash memory industry, several small form-factor flash memory module standards have evolved to meet the memory demands of portable compact electronic products and to meet the demand for an easily removable compact storage medium. Each of these small form-factor flash memory module standards share the following features: a compact structure and a rugged design. One such standard is the Solid State Floppy Disk Card (SSFDC) standard, a vendor-independent standard crafted by the SSFDC Forum. A flash memory device complying with the SSFDC standard functions with SSFDC products manufactured by any SSFDC vendor. The SSFDC standard has gained wide support and acceptance since its inception because of its simple structure, high portability, and interchangeability. The SSFDC standard has the distinction of being the lightest and thinnest of the currently available flash memory module standards. With a dimension of 45×37×0.76 mm, a SSFDC flash memory device is about half the size and the same thickness as a credit card.

Compared with currently available memory module formats, which use a semiconductor memory assembled on board, the SSFDC standard possesses a much simpler structure. A SSFDC flash memory device has an embedded NAND-type flash memory chip, but does not include a controller or any other substantive support logic circuitry. This simplified design allows the manufacture of a less costly memory device as compared to other types of memory module standards.

The NAND-type structure alludes to the serial arrangement of the memory cells in the SSFDC flash memory. By contrast, the NOR-type structure has the memory cells arranged in parallel. An advantage of the NAND-type structure is faster sequential accessing than the NOR-type structure. In addition, the NAND-type structure supports faster write and erase operations and permits fabrication of higher density memory chips or smaller and less-expensive chips of the same density.

Since the SSFDC flash memory device does not have an integrated controller, the controller can be implemented in numerous embodiments. The controller can be designed directly in a host computer system—as hardware or firmware—, an adapter or as a software-only solution on the host computer system. Resembling a floppy disk drive in which one disk drive functions with numerous floppy disks from a variety of vendors, one SSFDC controller from any SSFDC vendor can be used with any SSFDC flash memory device from a variety of SSFDC vendors.

The SSFDC flash memory device is optimally suited for use in portable devices requiring internal data storage and in low cost consumer products that process data including digital cameras, personal digital assistants, electronic musical instruments, voice recorders faxes, smart cellular phones, pagers, and other portable information-related products. Moreover, the SSFDC flash memory device can be used in equipment requiring removable memory for portability, version upgrades, or memory upgrades for software applications. Besides adding portability to products, the SSFDC flash memory device facilitates the reduction in size of electronic products.

The potential for data corruption in large digital memories poses problems for mission critical computer operations. Since such errors are likely to occur in large digital memories, most modern digital memories incorporate some sort of data reliability procedure to detect and possibly correct errors in the data bits. The SSFDC standard implements a data reliability procedure known as Hamming Code, a type of error correcting code (ECC).

When data bits in a digital memory are moved or stored, there is always a possibility that a mistake can be made, that is, a logic HIGH state interpreted as a logic LOW state or a logic LOW state taken to be a logic HIGH state. This can be caused by media defects, electronic noise, component failures, poor connections, deterioration due to age, environmental perturbations, and other factors. The mistakenly interpreted data bit represents a corrupted data bit—a data bit error. This data bit error could be soft (transient) or hard (permanent). Since this data bit error is a natural consequence of the type of technology employed in digital memory design, the digital memory must compensate for this data bit error by utilizing appropriate logic such as an error correcting code (ECC).

An ECC allows data bits being read or transmitted to be checked for errors and, when necessary, correct the errors "on the fly". It is even possible to detect and restore erased data bits with a particular ECC. The ECC differs from parity-checking in that errors are not only detected but are also corrected—within certain limitations. The power of the ECC is determined by the number and types of errors the ECC is capable of detecting and correcting within the particular data bits being processed by the ECC. A high power ECC can detect and correct many more types of errors and a greater number of errors than a low power ECC. A Hamming Code is an example of a low power ECC, one capable of detecting all single data bit errors and double data bit errors, but correcting only the single data bit errors. A double data bit error indicates two distinct data bits contain errors. The ECC is needed to ensure the accuracy and integrity of data bits as speed and density of digital memories increase—which is usually accompanied by an increase in data bit error rates. In general, the ECC increases the reliability of any computing, telecommunication, and digital memory system without adding much cost. Additionally, the ECC can be integrated within the digital memory device or implemented outside the digital memory device. The fundamental features of the ECC are (1) a module for detecting and correcting errors and (2) extra data bits added by the ECC module to the units of data bits being sent to the digital memory for storage. These extra data bits cannot be utilized by an ECC other than the type of ECC that originally generated the extra data bits.

The ECC can either be implemented in hardware or software. Under most circumstances, errors must be detected and corrected "on the fly", meaning at the same rate as data bits are being read or transmitted. Typically, only a hardware-implemented ECC can provide the performance level for "on the fly" detection and correction at high data transmission rates.

Generally, the ECC performs the error detection and correction on units of data bits. The ECC adds extra data bits to each unit of data bits. These extra data bits are data reliability bits generated by the ECC in response to each unit of data bits. The data reliability bits, when combined with the unit of data bits, form a certain structure. If that structure is altered by errors, the changes can be detected and corrected—within certain limitations.

The basic concept of an ECC can be understood by analogizing with English words. A combination of letters of the English alphabet may or may not form a legitimate English word. The dictionary of the English language provides only the legitimate English words. Errors that occur when transmitting or storing English words can be detected by determining if the received word is in the dictionary. If it is not, errors can be corrected by determining which legitimate English word approximately resembles the received word. The ECC works in a similar fashion.

In practice, when a unit of data bits is stored in the digital memory, data reliability bits that describe the unit of data bits are calculated by the ECC and stored along with the unit of data bits. When the unit of data bits is requested for reading, data reliability bits for the about-to-be read unit of data bits are again calculated by the ECC. She newly generated data reliability bits are compared with the data reliability bits generated when the unit of data bits was stored. If the data reliability bits match, the unit of data bits is considered free of errors and sent to its destination. If the data reliability bits do not match, the missing or erroneous data bits are determined by the ECC and then supplied or corrected.

As mentioned earlier, the SSFDC standard employs an ECC known as Hamming Code. The data reliability bits for the Hamming Code are stored in the SSFDC flash memory device, but the actual Hamming Code module, which performs the error detection and correction, resides outside the SSFDC flash memory device—usually in the SSFDC controller. The Hamming Code cannot be changed to a different ECC by the vendor/manufacturer since the SSFDC standard is a vendor-independent standard for which a variety of SSFDC products have been designed. These SSFDC products are configured to operate only with the data reliability bits for the Hamming Code—not just any ECC—since the data reliability bits are meaningful only to the Hamming Code.

Inside the SSFDC flash memory device, the flash memory cells are divided into groups called blocks. Each block is further divided into units called sectors. The SSFDC standard requires each sector to be defined as denoted in FIG. 1. Each sector 100 must be a length of five hundred twenty-eight bytes. The five hundred twenty-eight bytes are parcelled as follows: five hundred twelve bytes to USER DATA 10, four bytes to SCRATCH DATA 20, one byte to DATA STATUS 30, one byte to BLOCK STATUS 40, two bytes to BLOCK ADDRESS 50, three bytes to ECC1 60, two bytes to BLOCK ADDRESS 70, and three bytes to ECC2 80.

USER DATA 10 is further divided into two hundred fifty-six bytes for USER DATA1 12 and two hundred fifty-six bytes for USER DATA2 14. Data bits sent to the SSFDC flash memory device for storage are stored in USER DATA1 12 and USER DATA2 14.

SCRATCH DATA 20 can be utilized by the vendor/manufacturer tor storing bits of vendor-specific information. Without SCRATCH DATA 20, the SSFDC flash memory device could still function properly as a storage device.

DATA STATUS 30 holds bits of information concerning the operability of USER DATA 10. The SSFDC standard specifies several possible patterns of bits within DATA STATUS 30 that are appropriate for indicating specific conditions of USER DATA 10. Under normal operating conditions, DATA STATUS 30 is set to FFh.

BLOCK STATUS 40 holds bits of information concerning the operability of the block of which the sector 100 is a part. The SSFDC standard specifies several possible patterns of bits within BLOCK STATUS 40 that are appropriate for indicating specific conditions of the block of which the sector 100 is a part. The specific conditions include: defective block and good block. Under normal operating conditions, BLOCK STATUS 40 is set to FFh.

BLOCK ADDRESS 50 holds bits indicating the block address of USER DATA 10.

ECC1 60 stores the data reliability bits which the Hamming Code needs in order to perform error detection and correction on the data bits in USER DATA1 12. These data reliability bits would be useless to an ECC other than the Hamming Code.

BLOCK ADDRESS 70 holds bits indicating the block address of USER DATA 10.

ECC2 80 stores the data reliability bits which the Hamming Code needs in order to perform error detection and correction on the data bits in USER DATA2 14. These data reliability bits would be useless to an ECC other than the Hamming Code.

For an illustration of how the Hamming Code interacts with the SSFDC flash memory device refer to FIG. 2 and FIG. 3. Focusing on FIG. 2, a unit of data bits 210 to be programmed into the SSFDC flash memory device 200 is first processed by the Hamming Code 250. From the Hamming Code 250, the unit of data bits 230 is sent to the SSFDC flash memory device 200 for storing. The data reliability bits 220 generated by the Hamming Code for the unit of data bits 210 is stored with the unit of data bits 230.

Focusing on FIG. 3, a unit of data bits 310 read from the SSFDC flash memory device 300 is first processed by the Hamming Code 350. The data reliability bits 320 previously generated by the Hamming Code 350 are also transmitted to the Hamming Code 350. Within the Hamming Code 350, the unit of data bits 310 is checked for errors and corrected if any errors are detected—refer to the earlier discussion of the ECC for an explanation of how the ECC, such as the Hamming Code, accomplishes the error detection and correction. From the Hamming Code 350, the unit of data bits 360—now checked and corrected—proceeds to its destination.

FIG. 2 and FIG. 3 are merely intended to illustrate a particular implementation of the Hamming Code with the SSFDC flash memory device, but are not intended to limit the scope of the discussion to this particular implementation.

As discussed above, the Hamming Code is a low power ECC. This limits the SSFDC flash memory device to applications not requiring an extreme level of data reliability. In addition, the SSFDC flash memory device is currently unsuited to handled the higher error rates of future flash memory cell technologies such as multi-bit flash memory cells. Even if the ECC on the SSFDC controller was changed to a high power ECC by the vendor, the potential market for such a product would be stymied by the lack of compatibility with the existing SSFDC controllers and products designed with the Hamming Code. The reason for this outcome lies in the interdependence between the ECC and the data reliability bits. Since each type of ECC generates vastly different data reliability bits, one type of ECC could not utilize the data reliability bits from a different type of ECC. Thus, the existing SSFDC controller would be unable to function properly with the modified SSFDC flash memory device, which is configured to operate with a high power ECC, while the modified SSFDC controller, which is configured to operate with a high power ECC, would be unable to function properly with the existing SSFDC flash memory device, thus undermining the objective of having multiple SSFDC vendors designing SSFDC controllers and products that are compatible with the SSFDC controllers and products of other SSFDC vendors.

In sum, there is no SSFDC flash memory device with a high power ECC that is compatible with existing standards.

SUMMARY OF THE INVENTION

The present invention is a method of increasing data reliability of a flash memory device without compromising compatibility with existing memory products or an existing memory format. The flash memory device used in a way that is modified by the present invention adheres to the Solid State Floppy Disk Card (SSFDC) standard while continuing to function properly with existing SSFDC products. Simply stated, the increased data reliability is achieved by incorporating a high power Error Correcting Code (ECC) into a newly-designed SSFDC controller while retaining the conventional Hamming Code. A SCRATCH DATA within each sector of the SSFDC flash memory device is designated as the location for data reliability information for the high power ECC, thus avoiding conflict with the SSFDC standard. Furthermore, bits in a DATA STATUS and in a BLOCK STATUS of each sector are modified such that the SSFDC standard is not abandoned or altered beyond permissible limits. This modification of the bits in the DATA STATUS and in the BLOCK STATUS permits the DATA STATUS and the BLOCK STATUS to continue carrying out the function assigned to them by the SSFDC standard, as well as indicate whether the SCRATCH DATA contains the data reliability information for the high power ECC.

As a result, data reliability is improved because error detection and correction is performed by the high power ECC rather than the Hamming Code, which is a low power ECC. Any type of ECC can be utilized as the high power ECC.

Compatibility is maintained due to retention of the Hamming Code for use with existing SSFDC controllers operating with only the Hamming Code. By decoding bits in the DATA STATUS and the BLOCK STATUS, the newly-designed SSFDC controller, operating with the high power ECC and the low power Hamming Code, determines which ECC to perform on the data bits to be programmed into or read from the SSFDC flash memory device. Most importantly, the newly-designed SSFDC controller both generates data reliability bits for the Hamming Code and stores them in the SSFDC flash memory device whenever the newly-designed SSFDC controller generates and stores data reliability bits for the high power ECC. Similarly, the SSFDC flash memory device, which has been changed by storing the data reliability bits for the high power ECC in the SCRATCH DATA and by altering the bits of the DATA STATUS and the BLOCK STATUS, functions faultlessly when interacting with existing SSFDC controllers and products because the SSFDC flash memory device stores the data reliability bits for both the high power ECC and the Hamming Code.

DETAILED DESCRIPTION OF THE PREFERRED EMBODIMENT

Figure 1:
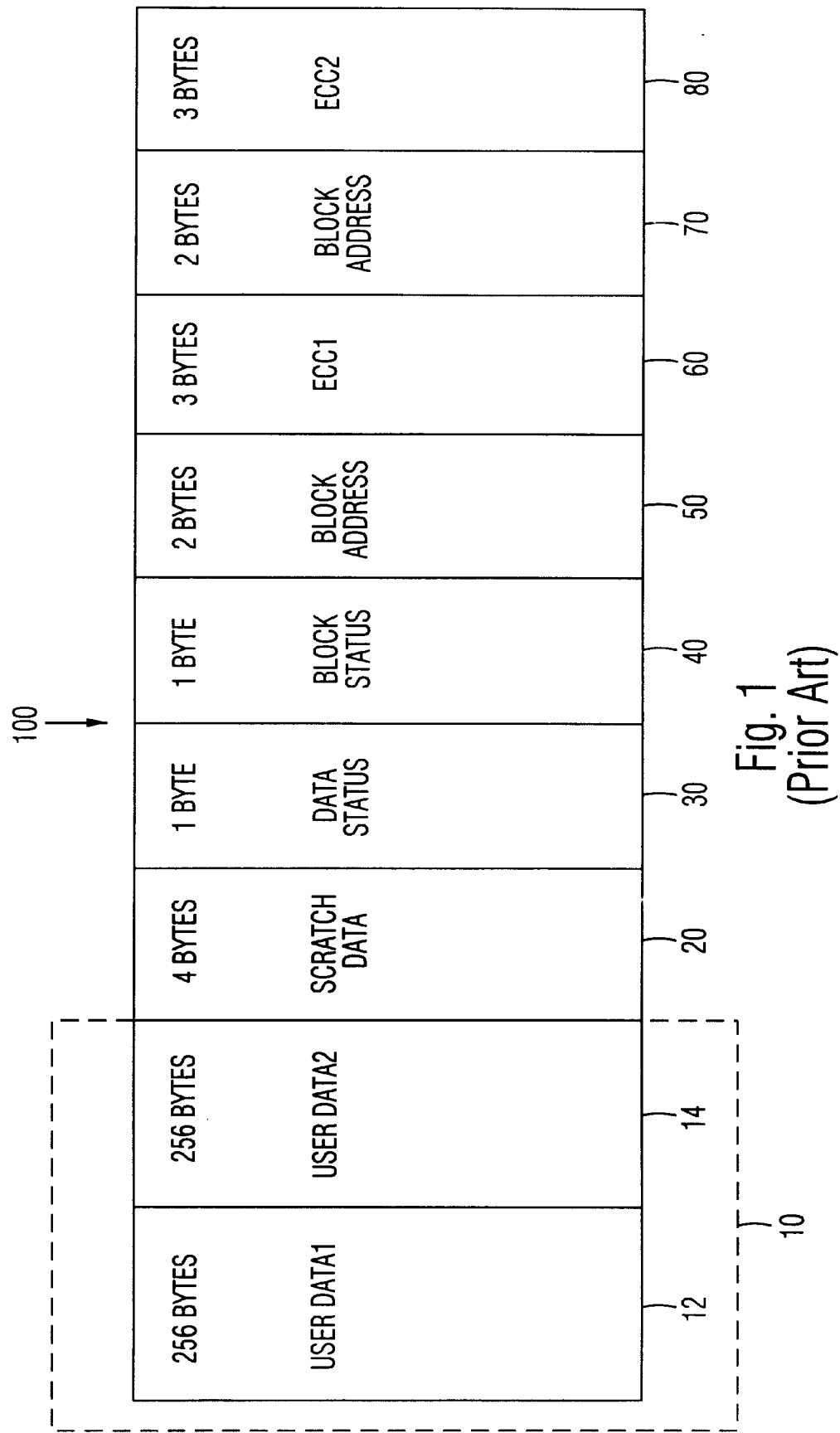
FIG. 1 illustrates the data storage format of a sector within the SSFDC flash memory device according to the prior art.

The method of the present invention increases the data reliability of a flash memory device without compromising compatibility with existing memory products and an existing memory format. Handling data reliability of a flash memory device requires addressing the errors in data bits caused by the corruption of the data bits through any of the sources of corruption discussed earlier. The use of multi-bit flash memory cells for expanding the capacity of the typical flash memory device degrades the data reliability of the flash memory device considerably. Although the flash memory device can be designed to minimize the sources of corruption, a more efficient and economical approach lies in confronting the errors in the data bits, once the errors have occurred, with a data reliability procedure. Achieving compatibility with existing products and an existing memory format entails incorporating essential features of existing processes into the new processes.

Incorporating high data reliability without the expense and inconvenience of incompatibility stimulates rapid market acceptance of the flash memory device and expands the range of possible applications for the flash memory device. A high power Error Correcting Code (HP ECC) is a data reliability procedure which provides increased data reliability capability. The integration of the high power ECC (HP ECC) into the operation of the flash memory device without losing compatibility is the crucial problem solved by the present invention.

By working within the parameters of a memory standard for the flash memory device, compatibility is not lost, but improved data reliability is achieved in a system configured to take advantage of this invention. Since the memory standard defines relevant operating conditions, data storage format, and data reliability procedure, but allows for variation to a limited extent, the present invention takes advantage of this permissible variation in the parameters of the memory standard. In particular, certain bits within the flash memory device that hold information about the internal operation of the flash memory device are altered—only to an extent not departing from the memory standard—so that the bits can serve multiple purposes. While continuing to hold internal operational information, the newly-altered bits also passively communicate the existence of the increased data reliability capability of the flash memory device. Additionally, specific bits within the flash memory device are designated—without conflicting with the memory standard—as repositories of the increased data reliability capability. Most importantly, data bits being programmed into or read from the flash memory device undergo a data reliability procedure, either a high level or a low level, communicated by the newly-altered bits. Capability to perform the high level and the low level data reliability procedures is required in order to maintain compatibility with the memory standard. Before initiating the data reliability procedure, the newly-altered bits are decoded to determine which particular data reliability procedure to perform on the data bits being programmed into or read from the flash memory device.

Although the preferred embodiment of the present invention will be disclosed with reference to a flash memory device configured to a Solid State Floppy Disk Card (SSFDC) standard, the present invention is applicable to other types of memory devices known to those skilled in the art, as well as to flash memory devices configured according to a variety of other memory standards known to those skilled in the art.

Reference will be made to a high power ECC (HP ECC). The HP ECC can be implemented as any type of ECC known to those skilled in the art. Additionally, a type of data reliability procedure different from an ECC can be substituted for the HP ECC. Preferably, the present invention is implemented to improve the data reliability of the SSFDC flash memory device. Alternatively, the present invention can be implemented to add other features to the data reliability of the SSFDC flash memory device.

As discussed earlier, flash memory cells within a SSFDC flash memory device are divided into groups called blocks. Each block is further divided into units called sectors. The sectors observe a data storage format dictated by the SSFDC standard.

Figure 4:
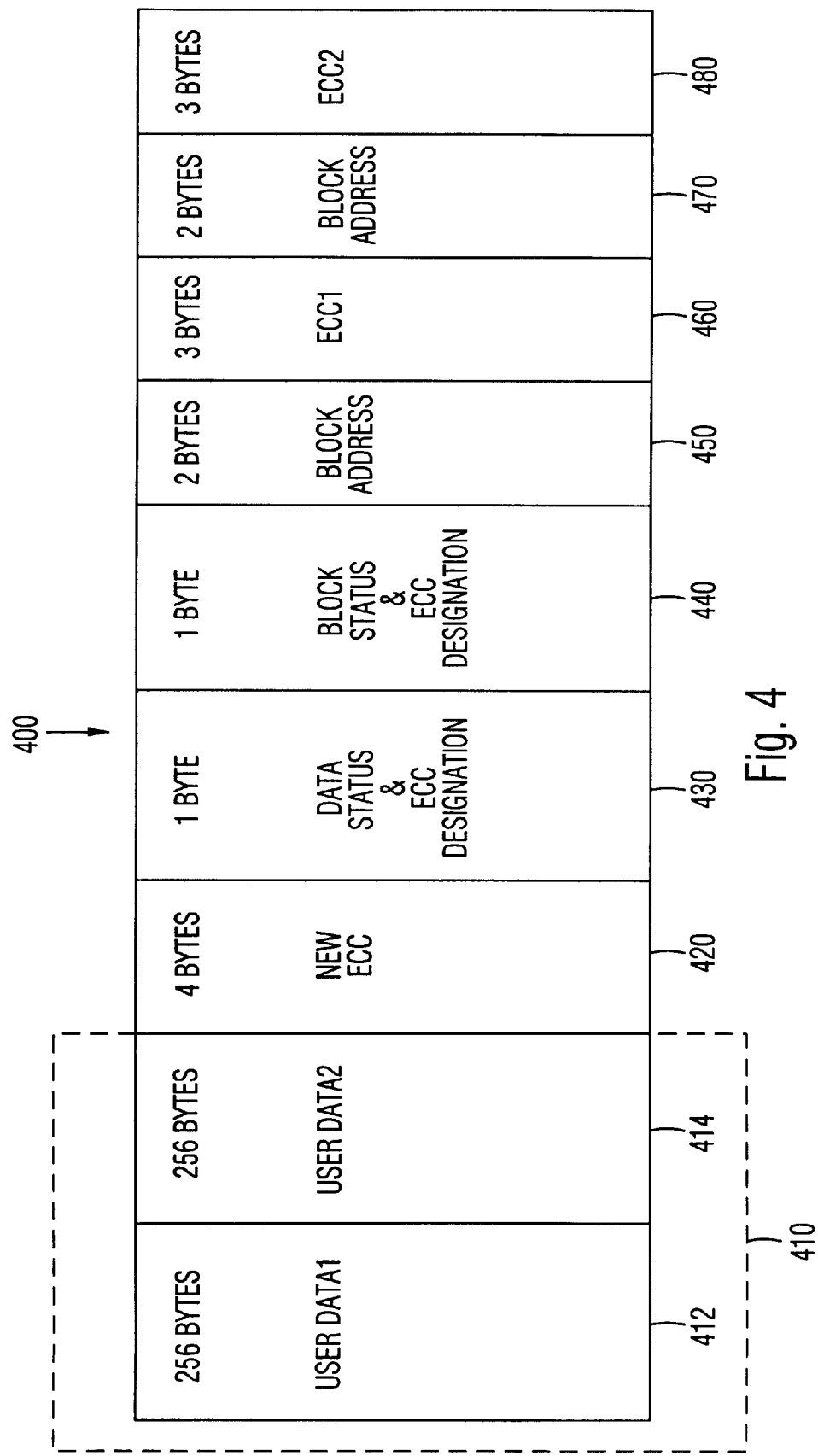
FIG. 4 illustrates the data storage format of a sector within the SSFDC flash memory device according to the present invention.

Referring to FIG. 4, the data storage format of a sector 400 within the SSFDC flash memory device is shown after being modified by the method of increasing data reliability without compromising compatibility. USER DATA1 412, USER DATA2 414, BLOCK ADDRESS 450, ECC1 460, BLOCK ADDRESS 470, and ECC2 480 remain unchanged when compared to FIG. 1. The description of each of these areas can be found above. The same function and limits are applicable. However, changes to the sector 400 can be best illustrated by referencing both FIG. 1 and FIG. 4.

The SCRATCH DATA 20 (FIG. 1) has been redesignated as a NEW ECC 420 (FIG. 4). Data bits within the NEW ECC 420 serve as repositories of data reliability bits for the high power Error Correcting Code (HP ECC). This change does not interfere with the SSFDC standard because the SCRATCH DATA 20 was originally utilized for storing only SSFDC vendor-specific information rather than critical operational information. Additionally, the NEW ECC 420 is sufficiently large to hold the data reliability bits for the HP ECC for all data bits in the entire USER DATA 410, unlike the prior art where USER DATA 10 was divided into USER DATA1 12 and USER DATA2 14 and the data reliability bits for the data bits were stored in ECC1 60 and ECC2 80.

The DATA STATUS 30 (FIG. 1) has been reassigned as a DATA STATUS & ECC DESIGNATION 430 (FIG. 4). Besides holding bits of information concerning the operability of the USER DATA 410, the bits in the DATA STATUS & ECC DESIGNATION 430 indicate whether the SCRATCH DATA 20 has been transformed into the NEW ECC 420 for use with the HP ECC. Because the SSFDC standard specifies several possible patterns of bits within the DATA STATUS 30 that are appropriate for indicating specific conditions of the USER DATA 10, the normal operating condition setting of the DATA STATUS & EEC DESIGNATION 430 is different from that of the DATA STATUS 30. Rather than being FFh under normal operating conditions, the DATA STATUS & ECC DESIGNATION 430 is set to any other setting which meets the following guidelines: (1) the setting does not conflict with the SSFDC standard and (2) the setting is not been utilized for any operating purpose by the SSFDC standard. For example, the SSFDC standard mandates that a specific number of bits with logic LOW values would indicate a particular operating condition of the USER DATA 410. Hence, the normal operating condition setting is formulated not to have the specific number of bits with logic LOW values to avoid unexpectedly triggering that particular operating condition.

The BLOCK STATUS 40 (FIG. 1) has been reassigned as a BLOCK STATUS & ECC DESIGNATION 440 (FIG. 4). Besides holding bits of information concerning the operability of the block of which the sector 400 is a part of, the bits in the BLOCK STATUS & ECC DESIGNATION 440 indicate whether the SCRATCH DATA 20 has been transformed into the NEW ECC 420 for use with the HP ECC. Because the SSFDC standard specifies several possible patterns of bits within the BLOCK STATUS 40 that are appropriate for indicating specific conditions of the block of which the sector 400 is a part of, the normal operating condition setting of the BLOCK STATUS & ECC DESIGNATION 440 is different from that of the BLOCK STATUS 40. Rather than being FFh under normal operating conditions, the BLOCK STATUS & ECC DESIGNATION 440 is set to any other setting which meets the following guidelines: (1) the setting does not conflict with the SSFDC standard and (2) the setting is not been utilized for any operating purpose by the SSFDC standard. For example, the SSFDC standard mandates that a specific number of bits with logic LOW values would indicate a particular operating condition of the block of which the sector 400 is a part. Hence, the normal operating condition setting is formulated not to have the specific number of bits with logic LOW values to avoid unexpectedly triggering that particular operating condition.

Preferably, the method of increasing data reliability of the SSFDC flash memory device without compromising compatibility is implemented in conjunction with a newly-designed SSFDC controller. Alternatively, the steps of the method can be implemented using other devices, circuits, or software known to those skilled in the art.

The newly-designed SSFDC controller (SSFDC controller) is capable of performing several data reliability procedures on bits being read from or programmed into the SSFDC flash memory device. The SSFDC controller preferably includes (1) means for decoding data bits in the BLOCK STATUS & ECC DESIGNATION and in the DATA STATUS & ECC DESIGNATION and (2) means for performing the data reliability procedures, such as the high power ECC and the Hamming Code.

The means for decoding can be implemented as a decoding circuitry, decoding software, or any equivalent implementation. As discussed above, under normal operating conditions, the bits in the BLOCK STATUS & ECC DESIGNATION and in the DATA STATUS & ECC DESIGNATION are set to particular settings that also indicate the presence of data reliability bits for the high power ECC in the NEW ECC. Thus, by decoding these particular settings, the means for performing the data reliability procedures can be configured to perform either the high power ECC or the Hamming Code on the data bits being programmed into or read from the SSFDC flash memory device.

The means for performing the data reliability procedures is coupled to the means for decoding. In addition, the means for performing the data reliability procedures can be implemented as logic circuitry, software, or any equivalent implementation. The means for performing the data reliability procedures includes means for generating the data reliability bits for the high power ECC, means for generating the data reliability bits for the Hamming Code, and means for assigning the data reliability bits for the high power ECC to the NEW ECC and the data reliability bits for the Hamming Code to the ECC1 and the ECC2. Each means for generating accomplishes the task of generating data reliability bits which are used as described previously. Both means for generating and the means for assigning can be implemented as logic circuitry, software, or any equivalent implementation.

Before performing the data reliability procedure on the data bits being programmed into or read from the SSFDC flash memory device, the means for performing needs information from the means for decoding concerning the data reliability procedure that should be performed. Depending on the information received from the decoding means, the means for performing performs either the high power ECC or the Hamming Code. More importantly, the means for performing generates the data reliability bits for the Hamming Code and assigns them to either the ECC1 or the ECC2 in the SSFDC flash memory device whenever the means for performing generates and assigns data reliability bits for the high power ECC to the NEW ECC in the flash memory device.

Preferably, the method of increasing data reliability of the SSFDC flash memory device without compromising compatibility modifies the bits of the DATA STATUS and the BLOCK STATUS. This modification transforms the DATA STATUS into the DATA STATUS & ECC DESIGNATION and transforms the BLOCK STATUS into the BLOCK STATUS & ECC DESIGNATION. Preferably, this modification is implemented by changing a source responsible for maintaining the settings of the bits stored in the DATA STATUS and in the BLOCK STATUS. The source can reside in the newly-designed SSFDC controller or can reside in any appropriate location apparent to those skilled in the art. Finally, the data reliability procedure is preferably implemented by the newly-designed SSFDC controller or implemented by any appropriate circuit or software apparent to those skilled in the art.

Figure 5:
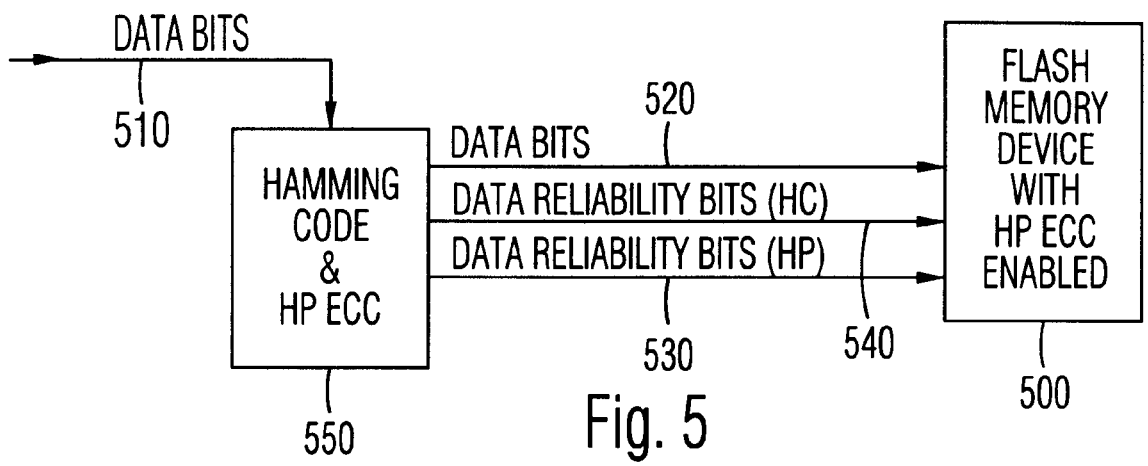
FIG. 5 illustrates the data reliability procedure during the program/write mode of the SSFDC flash memory device according to the present invention when the SSFDC flash memory device is formatted according to the present invention.
Figure 6:
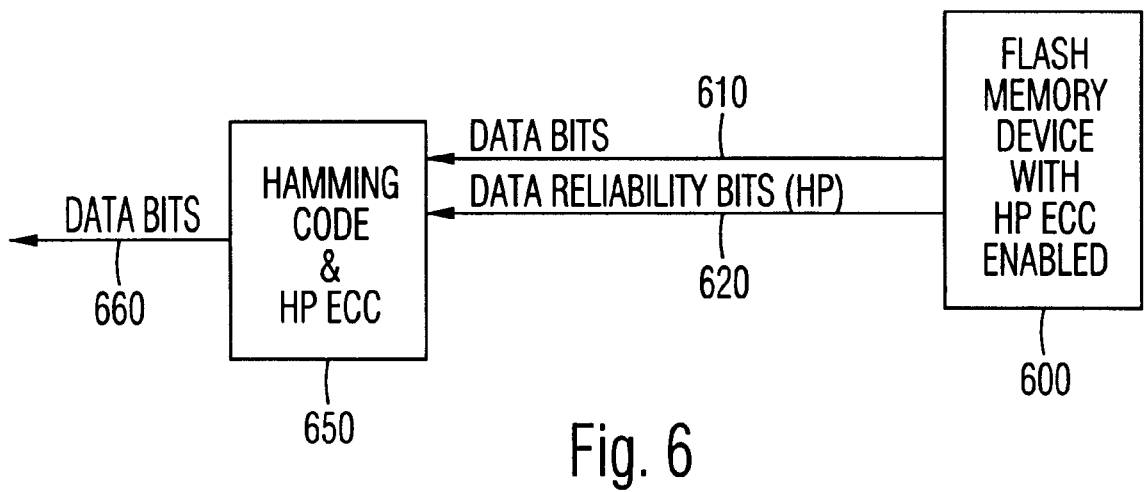
FIG. 6 illustrates the data reliability procedure during the read mode of the SSFDC flash memory device according to the present invention when the SSFDC flash memory device is formatted according to the present invention.

FIG. 5 and FIG. 6 illustrate the increased data reliability of the SSFDC flash memory device provided by the present invention.

FIG. 5 illustrates the interaction between the SSFDC flash memory device 500 formatted according to the present invention and a data reliability procedure module of the newly-designed SSFDC controller during the program/write mode of the SSFDC flash memory device 500. A unit of data bits 510 to be programmed into the SSFDC flash memory device 500 is first processed by the data reliability procedure module, Hamming Code & HP ECC 550. From the Hamming Code & HP ECC 550, the unit of data bits 520 is sent to the SSFDC flash memory device 500 for storing. Since the decoding of the DATA STATUS & ECC DESIGNATION (not shown) and BLOCK STATUS & ECC DESIGNATION (not shown) indicates support for the HP ECC for the unit of data bits 510 the Hamming Code & HP ECC 550 generates the data reliability bits (HP) 530 for the HP ECC code and the data reliability bits (HC) 540 for the Hamming Code and stores them with the unit of data bits 520 in the NEW ECC (not shown) and in ECC1(not shown) or ECC2 (not shown), respectively—as described previously.

FIG. 6 illustrates the interaction between the SSFDC flash memory device 600 formatted according to the present invention and the data reliability procedure module of the newly-designed SSFDC controller during the read mode of the SSFDC flash memory device 600. Focusing on FIG. 6, a unit of data bits 610 read from the SSFDC flash memory device 600 is first processed by the data reliability procedure module Hamming Code & HP ECC 650. Since the decoding of the DATA STATUS & ECC DESIGNATION (not shown) and BLOCK STATUS & ECC DESIGNATION (not shown) indicates support for the HP ECC, the data reliability bits (HP) 620 previously generated by the Hamming Code & HP ECC 550 (FIG. 5) are also transmitted to the Hamming Code & HP ECC 650. Within the Hamming Code & HP ECC 650, the unit of data bits 610 is checked by HP ECC for errors and corrected if any errors are detected—refer to the earlier description of the ECC for an explanation of how the ECC accomplishes the error detection and correction. From the Hamming Code & HP ECC 650, the unit of data bits 660—now checked and corrected—proceeds to its destination in a host computer system or other location. Since the HP ECC within the Hamming Code & HP ECC 650 performed a high level of error detection and correction, the unit of data bits 660 possesses a higher level of integrity and accuracy for use in a variety of critical operations or noncritical operations.

Figure 7:
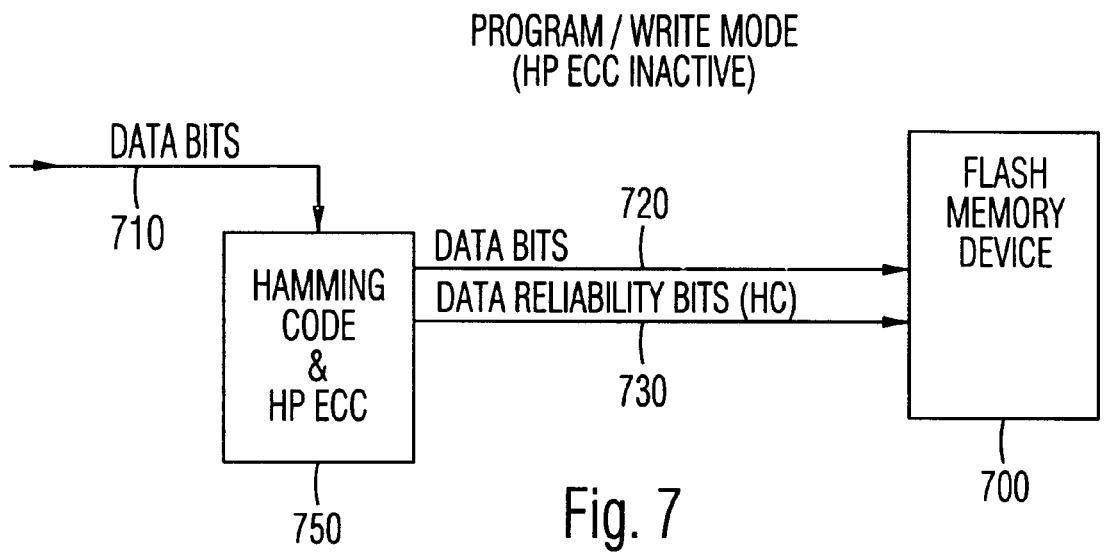
FIG. 7 illustrates the data reliability procedure during the program/write mode of the SSFDC flash memory device according to the present invention when the SSFDC flash memory device is formatted according to the prior art.
Figure 8:
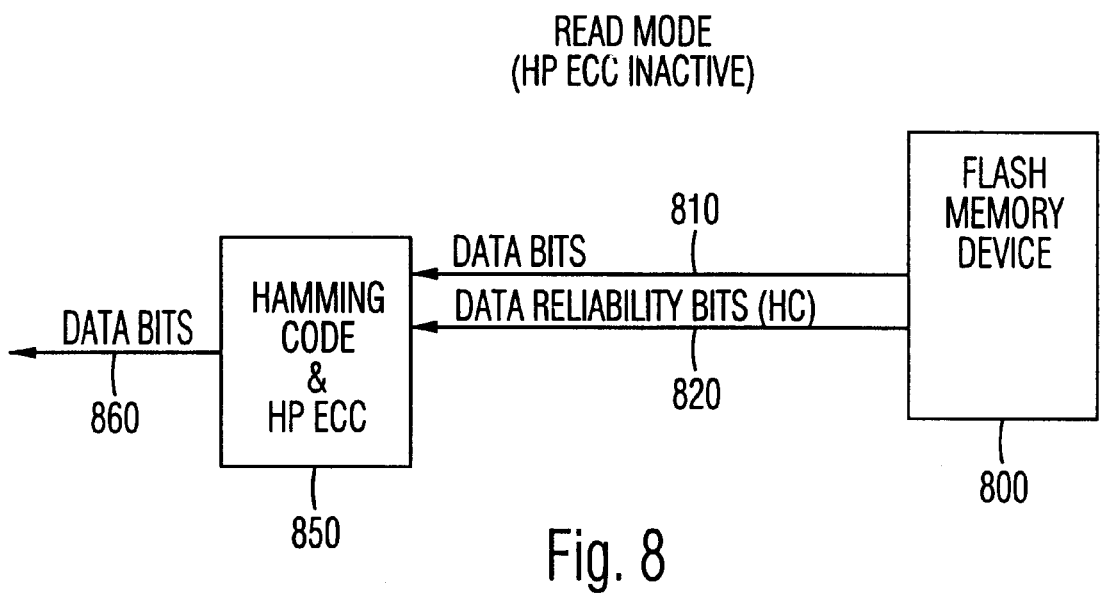
FIG. 8 illustrates the data reliability procedure during the read mode of the SSFDC flash memory device according to the present invention when the SSFDC flash memory device is formatted according to the prior art.

FIG. 7 and FIG. 8 illustrate the compatibility of the method for increasing the data reliability of the SSFDC flash memory device with existing SSFDC flash memory devices and an existing memory format, as provided by the present invention.

FIG. 7 illustrates the interaction between the SSFDC flash memory device 700 formatted according to the prior art and the data reliability procedure module of the newly-designed SSFDC controller during the program/write mode of the SSFDC flash memory device 700. A unit of data bits 710 to be programmed into the SSFDC flash memory device 700 is first processed by the data reliability procedure module, Hamming Code & HP ECC 750. From the Hamming Code & HP ECC 750, the unit of data bits 720 is sent to the SSFDC flash memory device 700 for storing. Since the decoding of the DATA STATUS (not shown) and BLOCK STATUS (not shown) fails to indicate support for the HP ECC, for the unit of data bits 710 the Hamming Code & HP ECC 750 generates only the data reliability bits (HC) 730 for the Hamming Code and stores them with the unit of data bits 720 in the ECC1(not shown) or ECC2(not shown)—as described previously.

FIG. 8 illustrates the interaction between the SSFDC flash memory device 800 formatted according to the prior art and the data reliability procedure module of the newly-designed SSFDC controller during the read mode of the SSFDC flash memory device 800. Focusing on FIG. 8, a unit of data bits 810 read from the SSFDC flash memory device 800 is first processed by the data reliability procedure module, Hamming Code & HP ECC 850. Since the decoding of the DATA STATUS (not shown) and BLOCK STATUS (not shown) fails to indicate support for the HP ECC, this time the data reliability bits (HC) 820 for the Hamming Code previously generated by the Hamming Code & HP ECC 750 (FIG. 7) are also transmitted to the Hamming Code & HP ECC 850. Within the Hamming Code & HP ECC 850, the unit of data bits 810 is checked by the Hamming Code for errors and corrected if any errors are detected—refer to the earlier description of the ECC for an explanation of how the ECC accomplishes the error detection and correction. From the Hamming Code & HP ECC 850, the unit of data bits 860—now checked and corrected—proceeds to its destination in a host computer system or other location.

Figure 2:
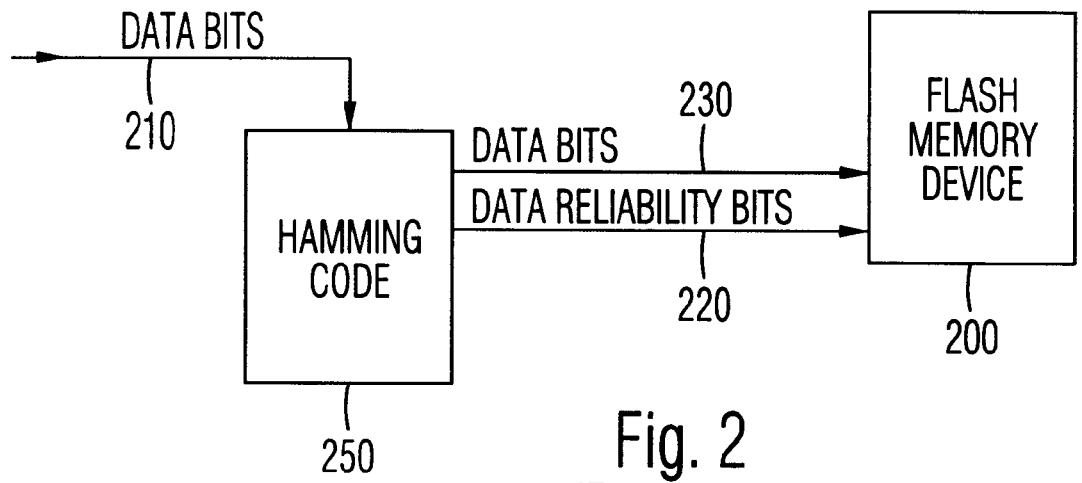
FIG. 2 illustrates the data reliability procedure during the program/write mode of the SSFDC flash memory device according to the prior art.
Figure 3:
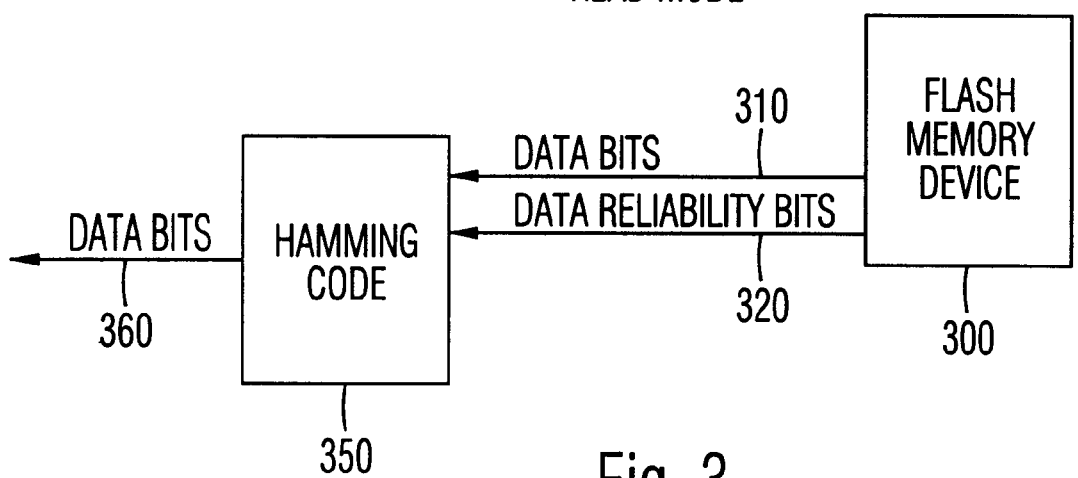
FIG. 3 illustrates the data reliability procedure during the read mode of the SSFDC flash memory device according to the prior art.

When a flash memory device, which is formatted according to the present invention, interacts with an existing SSFDC controller, the process proceeds similarly as described in FIG. 2 and FIG. 3, thus satisfying the goal of increasing data reliability without compromising compatibility.

The above figures are merely intended to illustrate a particular implementation of the present invention, but are not intended to limit the scope of the present invention to this particular implementation.

Although potentially all the bits in the DATA STATUS and in the BLOCK STATUS can be modified by the present invention, modifying fewer than all the bits or modifying other bits in other locations would not depart from the scope and spirit of the present invention. Additionally, the location for the data reliability bits for the HP ECC can be changed to a different location without departing from the scope or spirit of the present invention.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

I claim:

1. A method of increasing data reliability of a memory device without compromising compatibility, the method comprising steps of:
   a. modifying a predetermined bit located in a predetermined location within the memory device;
   b. decoding the predetermined bit, the predetermined bit holding a data reliability procedure code; and
   c. performing a data reliability procedure corresponding to the data reliability procedure code on a data bit.

2. The method according to claim 1 wherein the memory device is a flash memory device.

3. The method according to claim 2 wherein the flash memory device is configured as a Solid State Floppy Disk Card forum flash memory device.

4. The method according to claim 1 wherein the data reliability procedure is an error correcting code procedure.

5. The method according to claim 1 wherein the data reliability procedure code is designed such that the predetermined bit can continue carrying out a previously assigned function.

6. The method according to claim 1 wherein the data reliability procedure code is equivalent to a normal operational state of the predetermined bit.

7. The method according to claim 1 wherein the step of performing the data reliability procedure includes steps of generating a data reliability bit associated with the data reliability procedure being performed and storing the data reliability bit in the predetermined location in the memory device.

8. The method according to claim 7 wherein the predetermined location is a SCRATCH DATA designated location within the memory device.

9. The method according to claim 7 wherein the predetermined location is an ECC1 designated location within the memory device.

10. The method according to claim 7 wherein the predetermined location is an ECC2 designated location within the memory device.

11. The method according to claim 7 wherein the predetermined location is chosen such that the predetermined location can continue carrying out a previously allocated function.

12. The method according to claim 1 wherein the step of performing the data reliability procedure includes steps of generating a first data reliability bit associated with a first data reliability procedure when a second data reliability procedure is performed and storing the first data reliability bit in a first predetermined location in the memory device.

13. The method according to claim 12 wherein the first predetermined location is an ECC1 designated location within the memory device.

14. The method according to claim 12 wherein the first predetermined location is an ECC2 designated location within the memory device.

15. The method according to claim 1 wherein the predetermined location is a DATA STATUS designated location within the memory device.

16. The method according to claim 1 wherein the predetermined location is a BLOCK STATUS designated location within the memory device.

17. A controller for increasing the data reliability of a memory device without compromising compatibility, the controller comprising:
   a. means for decoding a predetermined bit located in a predetermined location within the memory device, the predetermined bit holding a data reliability procedure code; and
   b. means for performing a data reliability procedure corresponding to the data reliability procedure code on a data bit, the means for performing the data reliability procedure being coupled to the means for decoding the predetermined bit.

18. The controller according to claim 17 wherein the memory device is a flash memory device.

19. The controller according to claim 18 wherein the flash memory device is configured as a Solid State Floppy Disk Card forum flash memory device.

20. The controller according to claim 17 wherein the data reliability procedure is an error correcting code procedure.

21. The controller according to claim 17 wherein the data reliability procedure code is designed such that the predetermined bit can continue carrying out a previously assigned function.

22. The controller according to claim 17 wherein the data reliability procedure code is equivalent to a normal operational state of the predetermined bit.

23. The controller according to claim 17 wherein the means for performing the data reliability procedure includes means for generating a data reliability bit associated with the data reliability procedure being performed and means for assigning the data reliability bit to the predetermined location in the memory device.

24. The controller according to claim 23 wherein the predetermined location is a SCRATCH DATA designated location within the memory device.

25. The controller according to claim 23 wherein the predetermined location is an ECC1 designated location within the memory device.

26. The controller according to claim 23 wherein the predetermined location is an ECC2 designated location within the memory device.

27. The controller according to claim 23 wherein the predetermined location is chosen such that the predetermined location can continue carrying out a previously allocated function.

28. The controller according to claim 17 wherein the means for performing the data reliability procedure includes means for generating a first data reliability bit associated with a first data reliability procedure when a second data reliability procedure is performed and means for assigning the first data reliability bit to a first predetermined location in the memory device.

29. The controller according to claim 28 wherein the first predetermined location is an ECC1 designated location within the memory device.

30. The controller according to claim 28 wherein the first predetermined location is an ECC2 designated location within the memory device.

31. The controller according to claim 17 wherein the predetermined location is a DATA STATUS designated location within the memory device.

32. The controller according to claim 17 wherein the predetermined location is a BLOCK STATUS designated location within the memory device.

33. A memory system achieving increased data reliability without compromising compatibility, the memory system comprising:
   a. a memory device; and
   b. a controller coupled to the memory device, the controller having:
      i. means for decoding a predetermined bit located in a predetermined location within the memory device, the predetermined bit holding a data reliability procedure code; and
      ii. means for performing a data reliability procedure corresponding to the data reliability procedure code on a data bit, the means for performing the data reliability procedure being coupled to the means tor decoding the predetermined bit.

34. The memory system according to claim 33 wherein the memory device is a flash memory device.

35. The memory system according to claim 34 wherein the flash memory device is configured as a Solid State Floppy Disk Card forum flash memory device.

36. The memory system according to claim 33 wherein the data reliability procedure is an error correcting code procedure.

37. The memory system according to claim 33 wherein the data reliability procedure code is designed such that the predetermined bit can continue carrying out a previously assigned function.

38. The memory system according to claim 33 wherein the data reliability procedure code is equivalent to a normal operational state of the predetermined bit.

39. The memory system according to claim 33 wherein the means for performing the data reliability procedure includes means for generating a data reliability bit associated with the data reliability procedure being performed and means for assigning the data reliability bit to the predetermined location in the memory device.

40. The memory system according to claim 39 wherein the predetermined location is chosen such that the predetermined location can continue carrying out a previously allocated function.

41. The memory system according to claim 33 wherein the means for performing the data reliability procedure includes means for generating a first data reliability bit associated with a first data reliability procedure when a second data reliability procedure is performed and means for assigning the first data reliability bit to a first predetermined location in the memory device.

* * * * *

UNITED STATES PATENT AND TRADEMARK OFFICE
CERTIFICATE OF CORRECTION

PATENT NO. : 6,041 001
DATED : March 21, 2000
INVENTOR(S) : Petro Estakhri

It is certified that error appears in the above-indentified patent and that said Letters Patent is hereby corrected as shown below:

IN THE SPECIFICATION

In column 1, line 65, insert - - , - - after "adapter".

In column 3, line 30, delete "She" and insert - - The - -.

In column 4, line 2, delete "tor" and insert - - for - -.

Signed and Sealed this

Sixth Day of March, 2001

Attest:

NICHOLAS P. GODICI

Attesting Officer

Acting Director of the United States Patent and Trademark Office